United States Patent
Dupuy et al.

(10) Patent No.: US 6,423,991 B1
(45) Date of Patent: Jul. 23, 2002

(54) FIELD EFFECT TRANSISTOR AND METHOD OF MAKING

(75) Inventors: Phillipe Dupuy, Toulouse (FR); Steven L. Merchant, Phoenix; Robert W. Baird, Mesa, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/562,604

(22) Filed: May 1, 2000

Related U.S. Application Data (62) Division of application No. 09/088,027, filed on Jun. 1, 1998.

(51) Int. Cl.[7] .................................................. H01L 27/10
(52) U.S. Cl. ........................ 257/207; 257/202; 257/208
(58) Field of Search ................................ 257/202–208, 257/401–410, 565, 327; 438/128, 129, 275, 289

(56) References Cited

U.S. PATENT DOCUMENTS

| | | | |
|---|---|---|---|
| 4,918,333 A | | 4/1990 | Anderson et al. ............ 307/270 |
| 4,924,111 A | | 5/1990 | Anderson et al. ............ 307/270 |
| 5,003,370 A | | 3/1991 | Kashiwagi .................... 357/39 |
| 5,365,099 A | | 11/1994 | Phipps et al. ................ 257/328 |
| 5,635,737 A | * | 6/1997 | Yin .............................. 257/204 |
| 5,677,555 A | * | 10/1997 | Kalpakjian et al. ......... 257/206 |
| 5,920,089 A | * | 7/1999 | Kanazawa et al. .......... 257/202 |

* cited by examiner

Primary Examiner—Tom Thomas
Assistant Examiner—Cuong Q. Nguyen
(74) Attorney, Agent, or Firm—Robert L. King (57) ABSTRACT

A field effect transistor (30) has an array of transistors (31) made up of bonding pads (45–47) and sub-arrays of transistors (41–43). The bonding pads (45–47) are distributed between the sub-arrays of transistors (41–43) to reduce the maximum temperature that any portion of the FET (30) is exposed to while the FET (30) is in a conducting state. A similar effect can be appreciated by adjusting the threshold voltage or pinch-off resistance of the transistors in a portion (101) of an array of transistors (95).

20 Claims, 6 Drawing Sheets

*- PRIOR ART -*

FIELD EFFECT TRANSISTOR AND METHOD OF MAKING

The present application is a divisional application of U.S. application Ser. No. 09/088,027, filed on Jun. 1, 1998, which is hereby incorporated by reference, and priority thereto for common subject matter is hereby claimed.

BACKGROUND OF THE INVENTION

This invention relates, in general, to semiconductor devices, and more particularly, to field effect transistors that are arranged in an array configuration for high power applications.

During operation, power FETs generate a significant amount of heat due to the relatively high current densities that flow through the FETs. The amount of heat that is generated can be enough to damage structures within the array, or at the very least, affect the mean time to failure of the device in a customer's application.

One technique to address this problem is shown in U.S. Pat. No. 5,003,370, which issued to Shunji Kashwagi on Mar. 26, 1992. The solution shown is directed to applications that operate at high frequencies (e.g., 900 MHz), and thus, applications with relatively short "on" times (approximately 1–50 nanoseconds). Simply stated, the solution involves increasing the effective distance between individual cells by configuring the cells in a zigzag pattern so that there is an inactive heatsink between each cell. However, the solution is only practical for devices that have short "on" times (less than 50 nanoseconds) because the heatsinks between each cell can only dissipate a relatively small amount of energy.

Accordingly, a need exists to provide a semiconductor device that has improved energy dissipation capability when the device is operated for a long period of time. It would also be advantageous if the device could be formed without increasing its size so as not to increase its manufacturing complexity or cost.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

Figure 1:
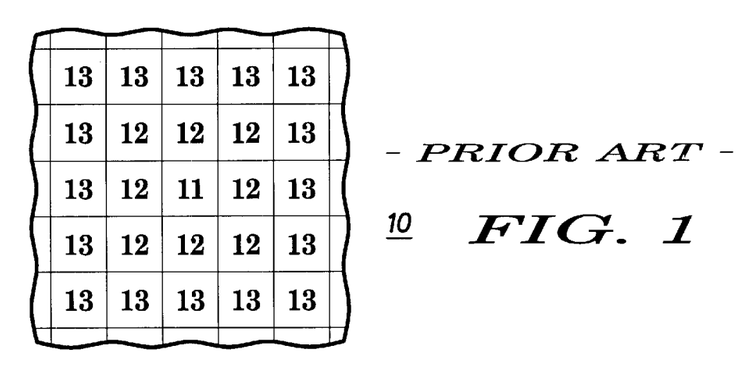
FIG. 1 is a block representation of a previously known power device.

Power transistors are typically arranged as an array of repeating cells with each of the cells providing a portion of the current for the power transistor. For example, FIG. 1 is provided only to illustrate an example of how conventional power devices are arranged. FIG. 1 is a partial view of a power field effect transistor (FET) 10 that is made up of individual cells 11–13. Each of cells 11–13 is a transistor that has a source region, a drain region, and a gate structure, each cell 11–13 provides a portion of the current flow for FET 10. By electrically connecting each of the cells together, FET 10 has a current carrying capability that is approximately equal to the sum of each of the individual cells 11–13.

Applicants have discovered that with such conventional array configurations the power dissipation across the array of transistors is not uniform. When FET 10 is in operation, each of cells 11–13 generates heat that is proportional to the voltage potential times the current flowing through each cell 11–13. In addition, each cell 11–13 is further heated by the cells 11–13 that surround it. For example, a central cell 11 not only generates its own heat during operation, but is heated by adjacent cells 12, which in turn are heated by adjacent cells 13. The net effect is that cells in the center of an array are typically hotter than cells near the edge of the array.

Figure 2:
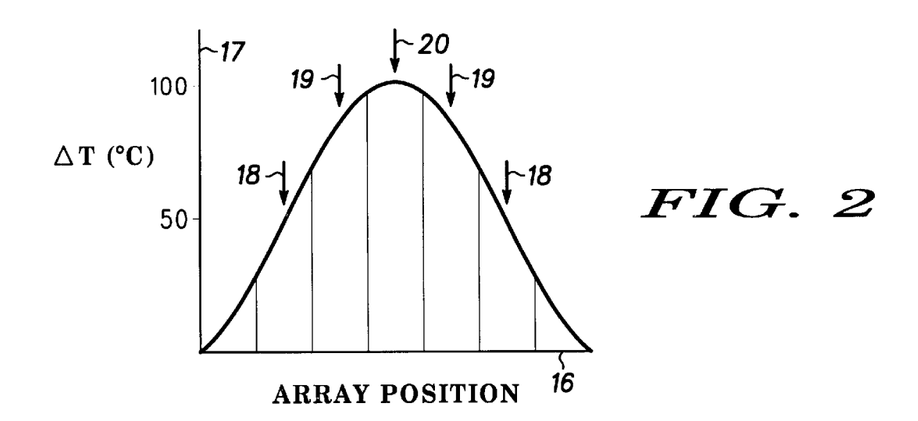
FIG. 2 is a graph of the increase in temperature across the power device during operation.

This non-uniform power dissipation profile is illustrated in the graph of FIG. 2. The graph has an x-axis 16 that represents the position across a central portion of FET 10. The leftmost and rightmost portion of x-axis 16 represents the temperature increase in cells 13 along the periphery of FET 10. The central portion of x-axis 16 represents the increase in temperature of central cell 11. Y-axis 17 represents the increase in temperature of each cell. The change in temperature ($\Delta T$) is the increase in temperature of a cell 11–13 as it transitions from a non-conducting to a conducting state in degrees Celsius (° C.).

Arrows 18 represent the increase in temperature at periphery cells 13, arrows 19 represent the increase in temperature at cells 12, and arrow 20 represents the increase in temperature at central cell 11. As shown in the graph, central cell 11 is subjected to the highest temperatures during the operation of FET 10. The increase in temperature can exceed over 125° C., which exposes cell 11 to possibly fatal temperature conditions that destroy the structures that make up the transistor. Consequently, the amount of energy that FET 10 can dissipate is limited by the maximum temperature that cell 11 can be exposed to and still operate reliably.

Figure 3:
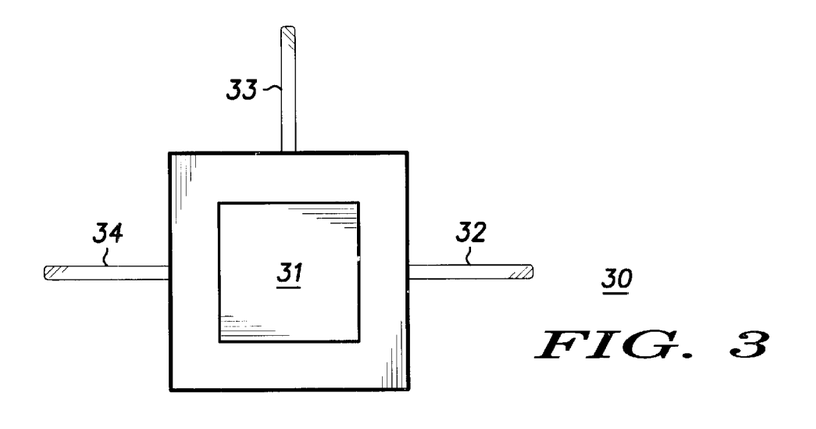
FIG. 3 is a simplified representation of a field effect transistor in accordance with an embodiment of the present invention.

FIG. 3 is a simplified representation of a semiconductor device 30 in accordance with the present invention. Preferably, semiconductor device 30 is a field effect transistor (FET) that has at least three terminals 32–34 that are connected to an array of transistors 31. As will be explained in more detail below, array of transistor 31 includes a repeating pattern of individual transistors that each have two current carrying electrodes, namely a source region and a drain region, and a control electrode that is used to control or enable a current flow between the current carrying electrodes.

Terminals 32–34 provide the necessary control signals and voltage potentials to array of transistors 31 to operate FET 30. Terminals 32–34 can be the leads, pins, solder balls, etc. that extend from a semiconductor package, or represent the bonding pads, bonding wires, or interconnect structures that are used internally to provide voltage potentials to array of transistors 31. Two terminals 32–33 are used to provide power supply voltages (e.g., $V_{DD}$ and ground potentials) and one terminal 34 is used to provide a control voltage that is used to control the flow of current through each transistor in array of transistors 31.

Figure 4:
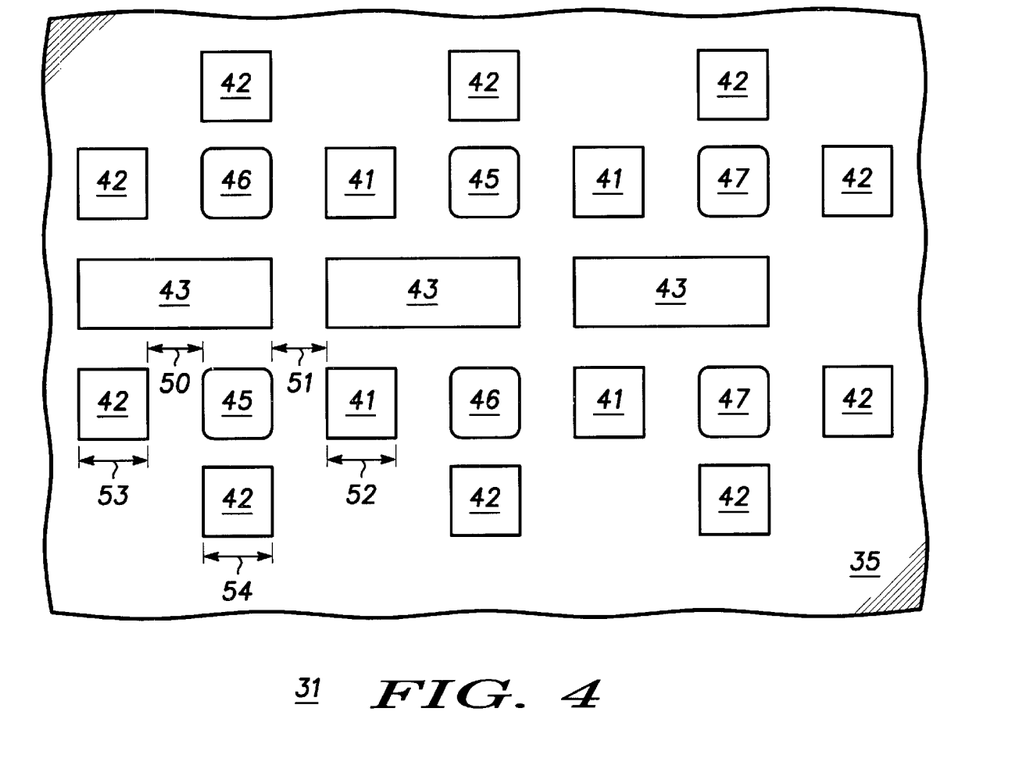
FIG. 4 is a top view of a portion of the field effect transistor in accordance with the present invention.

Turning now to FIG. 4, a more detailed description of array of transistors 31 is provided. Array of transistors 31 is divided into portions, sub-arrays of transistors, or sub-arrays 41–43 that are arranged on a semiconductor substrate 35. Each of sub-arrays 41–43 preferably comprises a plurality of field effect transistors that are configured in a repeating cell pattern so that each transistor is electrically connected together. Each of sub-arrays 41–43 is also electrically connected together so that all of the transistors cooperate to provide array of transistors 31.

Bonding pads 45–47 are carefully positioned throughout array of transistors 31 to provide heatsinks that more evenly distribute the energy dissipation across semiconductor substrate 35 when FET 30 is in operation. Bonding pads 45–47 are preferably connected to terminals 32–34 (see FIG. 3) with bonding wires or other interconnect structures so that bonding pads 45–47 can provide the necessary voltage potentials to array of transistors 31. For example, bonding pad 45 can provide the power supply voltage (i.e., $V_{DD}$), bonding pad 46 can provide a ground potential, and bonding pad 47 can be used to provide the control voltage that enables the transistors in each of sub-arrays 41–43.

As shown in FIG. 4, sub-arrays 41–43 each have a different configuration, however, it should be understood that more than three configurations are possible. Sub-arrays 42 represent the transistors that make up the periphery cells of array of transistors 31. Sub-arrays 41 represent the transistors that are positioned centrally in array of transistors 31 between various bonding pads 45–47. Sub-arrays 41 represent the transistors that extend from between various bonding pads 45–47 to the periphery of array of transistors 31.

In contrast, conventional power FETs are made from one undivided array of transistors that position the bonding pads around the periphery of the array of transistors. However, the present invention divides the array of transistors up into sub-arrays of transistors 41–43 that are separated by bonding pads 45–47. Preferably, sub-arrays 41–43 contain the same number of transistors as a conventional device that has its bonding pads around the perimeter of the array. For example, bonding pad 45, which is connected to terminal 32 (see FIG. 3) is positioned between sub-array of field effect transistors 42 and second sub-array of field effect transistors 41. Bonding pad 46, which is connected to terminal 33 (see FIG. 3) is positioned between sub-array of field effect transistors 41 on two sides, and between sub-array of field effect transistors 43 and sub-array of field effect transistors 42 on its other sides.

As shown in FIG. 4, bonding pad 45 is separated from sub-array 42 by a distance (indicated with a line 50) that is preferably about 1 micrometer (em) to 50 μm. Bonding pad 45 is also separated from sub-array 41 by a distance (indicated with a line 51) that is preferably about 1 μm to 50 μm. In the preferred embodiment, bonding pad 45 is equidistant from sub-array of field effect transistors 42 and sub-array of field effect transistors 41. Similarly, bonding pad 46 is equidistant from sub-arrays 41.

The reduction in the maximum temperature that any portion of array of transistor 31 is exposed to during operation can be further optimized by adjusting the width of bonding pads 45–47 (indicated with a line 54) relative to the width of sub-arrays 41 and 42 (indicated with lines 52 and lines 53, respectively). To properly operate as a heatsink for the energy created by the surrounding transistors, the width of bonding pads 45–47 should be within about thirty percent of the width of the sub-arrays 41. Preferably, the width of bonding pads 45–47 should be within about ten percent of the width of the sub-arrays 41, and even more preferably, the width of bonding pad 45 is approximately equal to the width of the sub-array 41. In addition the width of sub-array 42 should be greater than the width of the sub-array 41 because the transistors in sub-array of transistors 41 is surrounded by more active structures that generate heat when array of transistors 31 is in operation.

As shown in FIG. 4, sub-arrays with the same reference number are approximately equal in size. This is so the layout for array of transistors 31 can be as efficient as possible. It should be understood that each of sub-arrays 41–43 need not be the same size, and that each could even be different in size.

Figure 5:
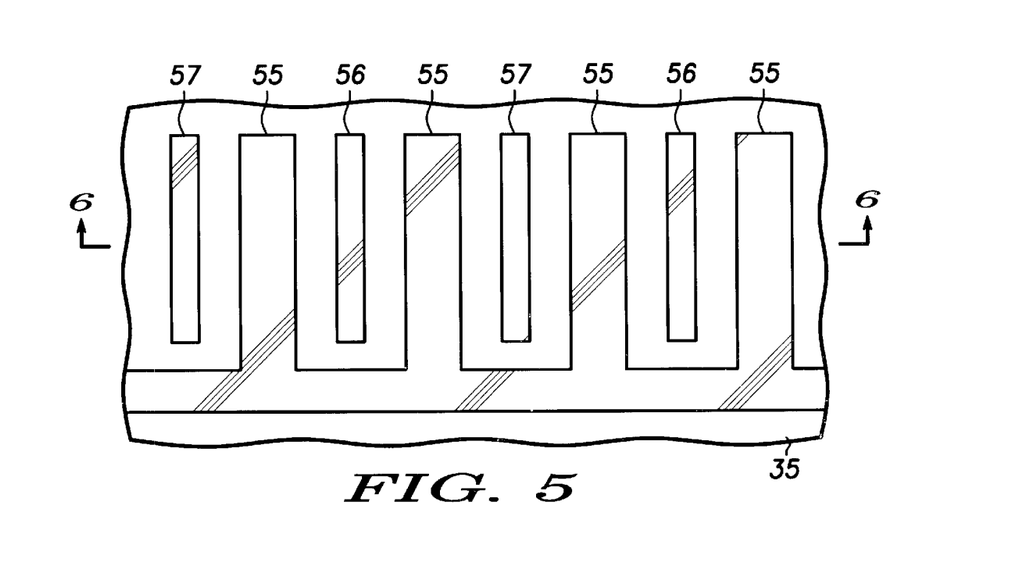
FIG. 5 is a top view of a portion of a sub-array of transistors of the field effect transistor in accordance with an embodiment of the present invention.
Figure 6:
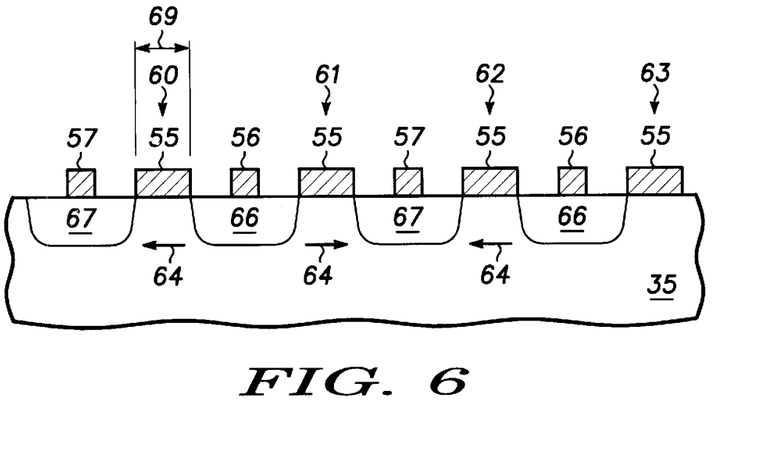
FIG. 6 is a cross-sectional view of the sub-array of transistors in accordance with an embodiment of the present invention.

Referring now to FIGS. 5 and 6, a more detailed explanation of the configuration of each sub-array of transistors 41–43 is provided. FIG. 5 is a top view of a portion of a sub-array 41–43, and FIG. 6 is a cross-sectional view taken along the section-lines 6—6 shown in FIG. 5. Each sub-array 41–43 is made up of individual lateral field effect transistors 60–63 that are connected together to provide FET 30 (see FIG. 1). FIGS. 5–6 are intended to illustrate only a portion of a sub-array 41–43 as the structures shown in FIGS. 5–6 are preferably repeated across semiconductor substrate 35 to increase the current carrying capability of FET 30. Although FIG. 6 only shows four transistors 60–63, it should be understood that each sub-array 41–43 would probably have at least eight transistors and could even have fifty or more transistors.

As shown in FIG. 6, each transistor 60–63 is made up of a gate structure 55, a drain region 66, and a source region 67. Metal lines 56 and 57, or other suitable interconnect material, are used to provide an electrical connection to drain regions 66 and source regions 67, respectively. Transistors 60–63 are configured so that adjacent transistors 60 and 61 share a common drain region 66, which are connected to other drain regions 66 and to bonding pads 45 (see FIG. 4). Transistors 60–63 also have common source regions 67, which are connected to other source regions 67 and to bonding pads 46. Each of gate structures 55 is electrically connected to the other gate structures 55. During the operation of FET 30, a control voltage is applied to gate structures 55 (e.g., from terminal 34 (see FIG. 3) or bonding pads 47 (see FIG. 4) to control the flow of current through transistors 60–63. The general direction of the current flow when FET 30 is in operation is indicated in FIG. 6 with arrows 64.

Transistors 60–63 are made using techniques well known in the art. Preferably, each of transistors 60–63 is formed so as to be identical to the other transistors in each sub-array 41–43, and thus, each of transistors 60–63 have a substantially identical gate length (indicated in FIG. 6 with a line 69) and a substantially identical threshold voltage.

Figure 7:
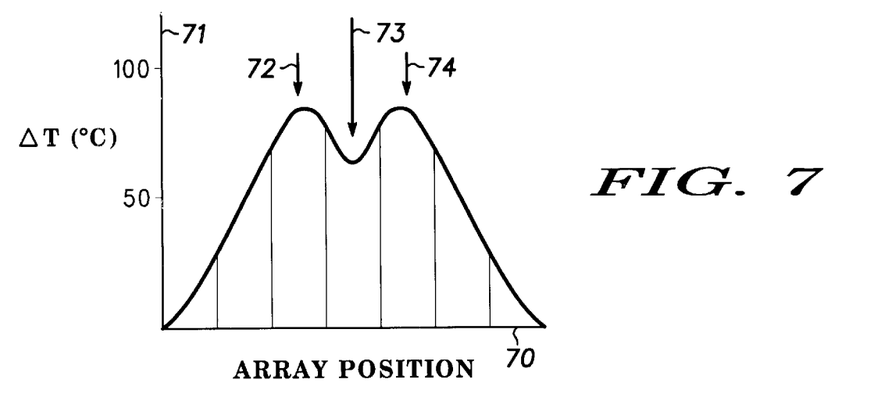
FIG. 7 is a graph of illustrating the improvement in energy dissipation of an embodiment of the present invention.

The improvement in the distribution of energy dissipation that can be appreciated with the present invention is best illustrated in FIG. 7. FIG. 7 is a graph illustrating the increase in temperature across array of transistors 31 (see FIG. 4) that occurs when FET 30 is in operation. Along a y-axis 71 the change in temperature between when FET is in a non-conducting state versus when FET is in a conducting state is shown. An x-axis 70 represents various points across array of transistors 31. Arrows 72 and 74 indicates the increase in temperature that occurs in sub-array of transistors 42 and 41, respectively. An arrow 73 is used to illustrate the increase in temperature that occurs within bonding pad 45. As is apparent from the graph of FIG. 7, bonding pads 45–47 serve as heatsinks that help dissipate energy out of array of transistors 31.

It has been discovered that placing bonding pads throughout an array of transistors can reduce the maximum temperature that any one location within the array is exposed to by ten percent or more. Although on its face this improvement may seen insignificant, it has also been discovered that the lifetime of a device is exponentially proportionate to any decrease in the maximum temperature that the device is exposed to. Consequently, a ten percent reduction in maximum operating temperature doubles the lifetime of the device.

More importantly, the present invention can double the time to failure of a device without having to appreciably increase the size of the device. Instead of forming the bonding pads along the periphery of an array of transistors, the present invention distributes the bonding pads across the array while maintaining the same number of transistors in the array. Thus, the present invention only requires a nominal increase in the size of FET 30. Furthermore, the present invention does not require any additional processing steps. Therefore, the time to failure of a field effect transistor can be significantly improved without appreciably increasing its manufacturing cost.

Figure 8:
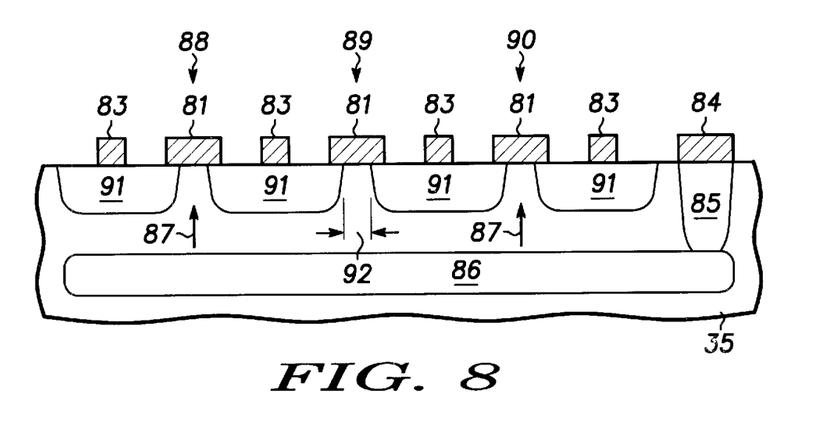
FIG. 8 is a cross-sectional view of a semiconductor device in accordance with another embodiment of the present invention.

Referring now to FIG. 8, an alternative configuration for sub-arrays of transistors 41–43 (see FIG. 4) is provided. Each of sub-arrays 4143 can be made of a repeating pattern of vertical field effect transistors 88–90. As shown in FIG. 8, each transistor 88–90 is made up of a gate structure 81 and a source region 91. Transistors 88–91 are configured so that they all share a common drain region 86, which is connected to bonding pads 45 (see FIG. 4). Metal lines 84 and 83, or other suitable interconnect material, are used to provide an electrical connection to drain regions 86 and source regions 91, respectively. An additional doped region 85 may be used to provide electrical connection between metal line 84 and drain region 86.

Adjacent transistors 88 and 89 share a common source region 91, which is connected to other source regions 91 and to bonding pads 46. Each of gate structures 81 is electrically connected to the other gate structures 81. During operation, a control voltage is applied to gate structures 81 (e.g., from terminal 34 (see FIG. 3) or bonding pads 47 (see FIG. 4) to control the flow of current through transistors 88–90. The general direction of the current flow when FET 30 is in operation is indicated in FIG. 8 with arrows 87.

Transistors 88–89 are preferably formed simultaneously using techniques well known in the art so that source region 91 of each of transistors 88–90 is equally spaced apart from the source region 91 of adjacent transistors. The distance between adjacent source regions is indicated in FIG. 8 with a line 92 and is preferably about 0.5 microns to 10 microns.

Figure 9:
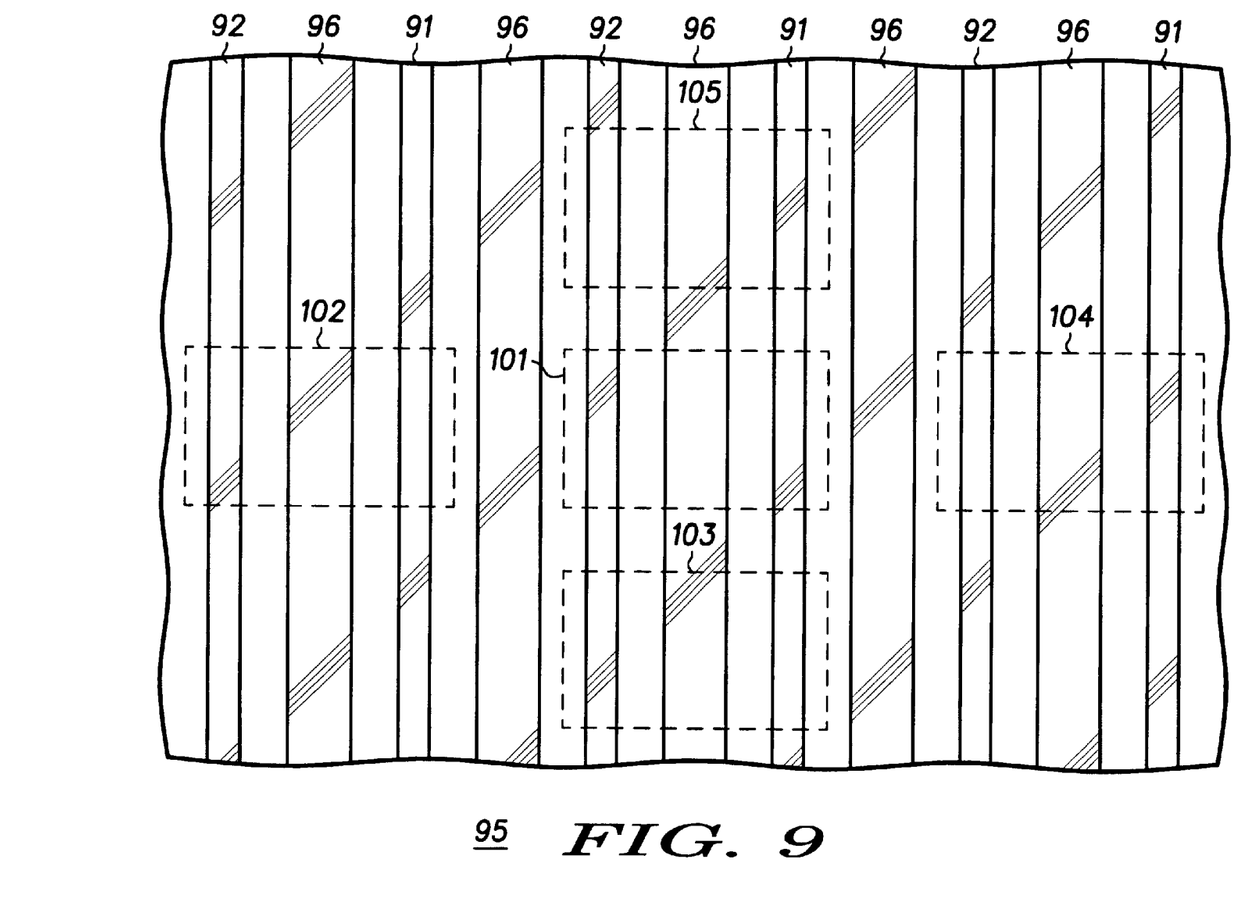
FIG. 9 is a top view of a portion of a field effect transistor in accordance with an alternative embodiment of the present invention.

Turning now to FIG. 9, an alternative configuration for an array of transistors 95 that can be used to provide FET 30 is provided. Rather than distribute heatsinks throughout an array of transistors 31 as shown in FIG. 4, this embodiment adjusts the energy dissipation profile of array of transistors 95 by altering the electrical characteristics of the individual transistors that make up array of transistors 95.

Array of transistors 95 is made up of field effect transistors that each have a source region, a drain region, and a gate structure 96. Each of the transistors is configured so that the source region of each transistor is electrically connected together, the drain region of each transistor is electrically connected together, and the gate structure 96 of each transistor is electrically connected together to provide FET 30. As shown in FIG. 9, electrical contact to the source region of each transistor is provided by an interconnect line 91, and electrical contact to the drain region of each transistor is provided by an interconnect line 92.

Dashed lines are used to divide array of transistors 95 into separate portions 101–105 that are used to explain how the energy dissipation of array of transistors 95 can be improved by adjusting the electrical performance characteristics of some of the transistors in array of transistors 95. Preferably, the physical geometries of all the transistors in each portion 101–105 of array of transistors 95 are identical because each transistor is formed simultaneously with the others. An additional ion implantation step can be used to adjust the threshold voltage of the transistors in portion 101 of array of array of transistors 95. For example, if the transistors in array of transistors 95 are n-channel enhancement mode devices, then doping portion 101 with a p-type dopant will increase the threshold voltage of the transistors in portion 101. Consequently, the transistors in portion 101 will conduct less current and dissipate less heat. Therefore, portion 101 of array of transistors 95 will have a smaller increase in temperature during operation compared to a device that formed the transistors in portion 101 with the same threshold voltage as the transistors in portions 102–105.

Figure 10:
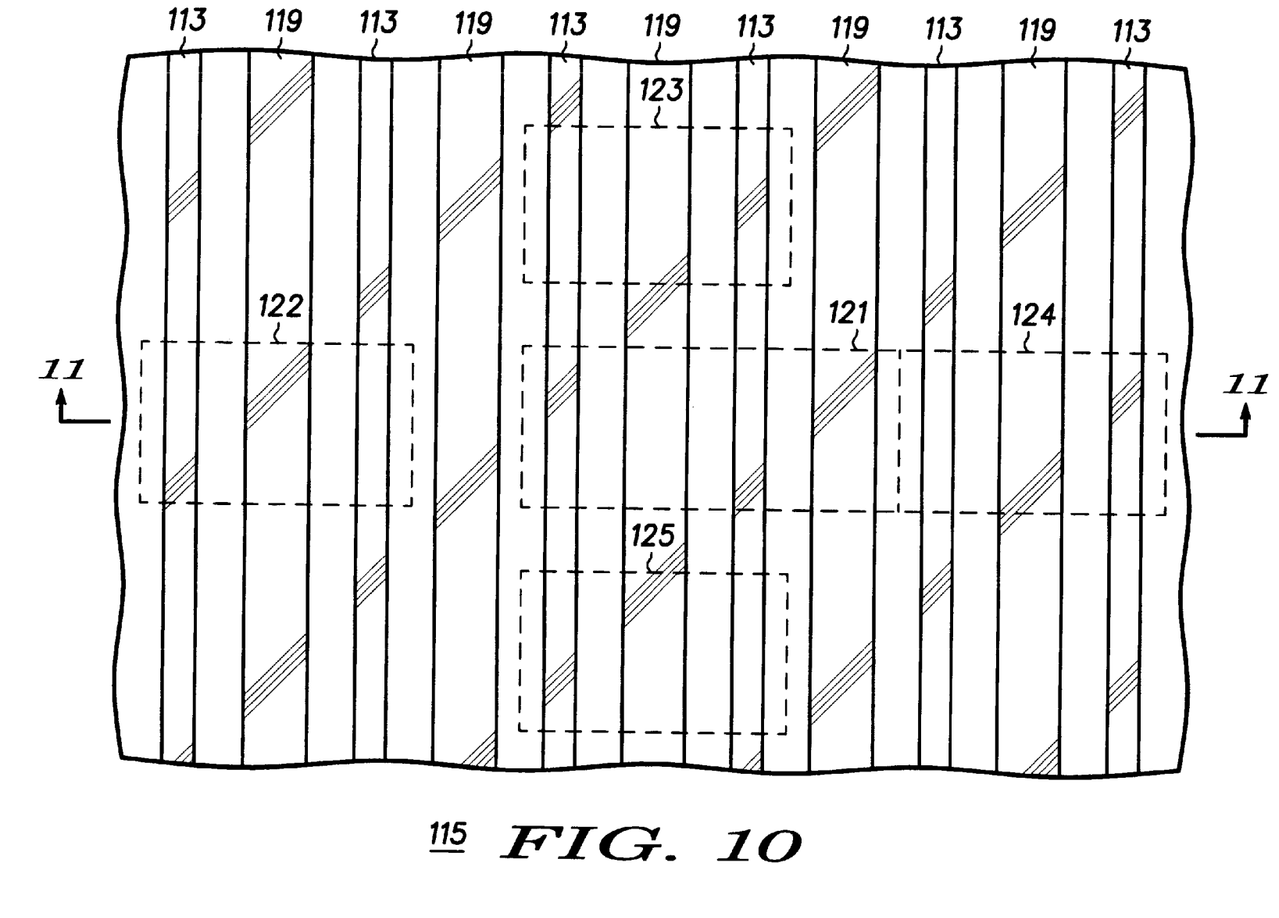
FIG. 10 is a top view of a portion of a field effect transistor in accordance with yet an another embodiment of the present invention.
Figure 11:
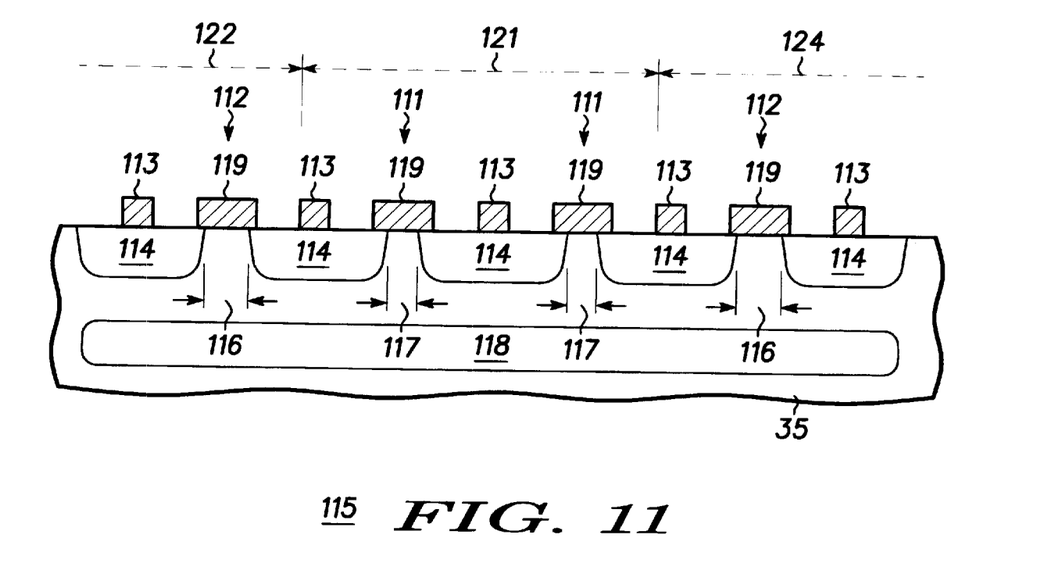
FIG. 11 is a cross-sectional view of the field effect transistor in accordance with the embodiment illustrated in FIG. 10.

In the example shown in FIG. 9, array of transistors 95 was made up of lateral field effect transistors. FIGS. 10–11 are provided to illustrate that a similar reduction in the maximum operating temperature could also be achieved if an array of transistors 115 were made from vertical field effect transistors 111–112. As shown in FIG. 10, array of transistors is divided into a central portion 121 that is surrounded by outer or periphery portions 122–125. Array of transistors 115 is formed so that transistors 111 in portion 121 conduct less current and generate less heat than transistors 112 in portions 122–125. As a result, the central portion 121 of array of transistors has a lower operating temperature, and thus, a longer time to failure. Section lines 11–11 are used in FIG. 10 to indicate the location of the cross-section illustrated in FIG. 11.

Referring to FIG. 11, each of transistors 111–112 shares a common drain region 118 in semiconductor substrate 35 and has a gate structure 119 that is electrically connected to the other gate structures 119. Preferably, the material used to provide gate structures 119 is of sufficiently low resistance that the control voltage on each of transistors 111–112 is maintained at approximately the same voltage potential when FET 30 is in a conducting state. This is desirable so that each of transistors 111–112 in array of transistors 115 cooperate equally to provide FET 30. Transistors 111–112 also have a source region 114 that is electrically connected to the other source regions 114. Interconnect lines 113 provide electrical connection to source regions 114.

To reduce the amount of current flowing through the transistors in portion 121 of array of transistors 115, the pinch-off resistance of transistors 111 is increased by increasing the distance between adjacent source regions 114. For example, the distance between adjacent source regions 114 of transistors 111 (indicated in FIG. 11 with a line 117) is approximately 1 microns to 5 microns. In contrast, transistors 112 in portions 122 and 124 have source regions 114 that are further apart. This distance is indicated in FIG. 11 with a line 116 and this distance is about 5 µm to 10 µm. The structure can be achieved in a variety of ways such as by adjusting the ion implantation mask that is used to define the locations of source regions 114. Since the distance between adjacent source regions 114 in transistors 111 is less than in transistors 112, transistors 111 conduct less current than transistors 112. Therefore, transistors 111 generate less heat than transistors 112 so that the energy dissipation of portion 121 of array of transistors 115 is less than portions 122–125.

By now it should be appreciated that the present invention provides a method for changing the energy dissipation across an array of transistors. In one embodiment this is accomplished by distributing bonding pads throughout the array of transistors which serve as heatsinks when the transistors are in operation. Alternatively, the energy dissipation across an array of transistors can be adjusted by forming the transistors in a central portion of the array of transistors so that they have a lower current density than transistors in the periphery of the array of transistors. For example the threshold voltage or pinch-off resistance of the transistors in the central portion of the array of transistors can be increased.

A field effect transistor in accordance with the present invention can be made from the same number of transistors and in the same amount of space as conventional devices, yet have a significant improvement in both its power dissipation profile and its time to failure. Furthermore, the benefits of the present invention are not limited to power devices that have relatively short "on" times as the boding pads placed throughout the array of transistors have sufficient heatsink capability to allow the FET to be operated for "on" times in excess of 10 micro-seconds (ms).

What is claimed is:

1. An array of field effect transistors comprising:
   a first terminal for a first power supply voltage;
   a second terminal for a second power supply voltage;
   a first sub-array of field effect transistors;
   a second sub-array of field effect transistors;
   a third sub-array of field effect transistors;
   a first bonding pad positioned between the first sub-array of field effect transistors and the second sub-array of field effect transistors, wherein the first bonding pad is coupled to the first terminal; and
   a second bonding pad positioned between the second sub-array of field effect transistors and the third sub-array of field effect transistors, wherein the second bonding pad is coupled to the second terminal.

2. The array of field effect transistors of claim 1 wherein first bonding pad is equidistant from the first sub-array of field effect transistors and the second sub-array of field effect transistors.

3. The array of field effect transistors of claim 2 wherein second bonding pad is equidistant from the second sub-array of field effect transistors and the third sub-array of field effect transistors.

4. The array of field effect transistors of claim 1 wherein the first sub-array, the second sub-array, and the third sub-array consist of a plurality of transistors that each have a substantially identical gate length.

5. The array of field effect transistors of claim 4 wherein the plurality of transistors comprises at least eight transistors.

6. The array of field effect transistors of claim 4 wherein the plurality of transistors comprises at least fifty transistors.

7. The array of field effect transistors of claim 4 wherein each of the plurality of transistors have a substantially identical threshold voltage.

8. The array of field effect transistors of claim 4 wherein each of the plurality of transistors is a lateral field effect transistor that has a drain region coupled to the first terminal and a source region coupled to the second terminal.

9. The array of field effect transistors of claim 8 wherein the field effect transistor has a third terminal for a control voltage, and each of the plurality of transistors has a gate structure coupled to the third terminal.

10. The array of field effect transistors of claim 4 wherein each of the plurality of transistors is a vertical field effect transistor that has a drain region coupled to the first terminal and a source region coupled to the second terminal.

11. The array of field effect transistors of claim 10 wherein the field effect transistor has a third terminal for a control voltage, and each of the plurality of transistors has a gate structure coupled to the third terminal.

12. The array of field effect transistors of claim 1 wherein the first bonding pad has a width, the first sub-array has a width, and the width of the first bonding pad is within about thirty percent of the width of the first sub-array.

13. The array of field effect transistors of claim 12 wherein the width of the first bonding pad is within about ten percent of the width of the first sub-array.

14. The array of field effect transistors of claim 13 wherein the width of the first bonding pad is approximately equal to the width of the first sub-array.

15. The array of field effect transistors of claim 1 wherein the first sub-array has a width, the second sub-array has a width, and the width of the first sub-array is greater than the width of the second sub-array.

16. The array of field effect transistors of claim 1 further comprising:
   a fourth sub-array of field effect transistors;
   a fifth sub-array of field effect transistors;
   a sixth sub-array of field effect transistors;
   a seventh sub-array of field effect transistors;
   an eighth sub-array of field effect transistors;
   a third bonding pad positioned between the sixth sub-array of field effect transistors and the seventh sub-array of field effect transistors, wherein the third bonding pad is coupled to the second bonding pad; and
   a fourth bonding pad positioned between the seventh sub-array of field effect transistors and the eighth sub-array of field effect transistors, wherein the fourth bonding pad is coupled to the first bonding pad.

17. The array of field effect transistors of claim 16 wherein the fourth sub-array of field effect transistors is positioned between the first bonding pad and the third bonding pad, and the fifth sub-array of field effect transistors is positioned between the second bonding pad and the fourth bonding pad.

18. The array of field effect transistors of claim 17 further comprising:
   a ninth sub-array of field effect transistors;
   a tenth sub-array of field effect transistors; and
   wherein the third bonding pad positioned between the ninth sub-array of field effect transistors and the fourth sub-array of field effect transistors, and the fourth bonding pad positioned between the tenth sub-array of field effect transistors and the fifth sub-array of field effect transistors.

19. The array of field effect transistors of claim 18 wherein the fourth sub-array of field effect transistors has a width and the ninth sub-array of field effect transistors has a width that is greater than the width of the fourth sub-array of field effect transistors.

20. The array of field effect transistors of claim 18 wherein each of the second sub-array of field effect transistors, the fourth sub-array of field effect transistors, fifth sub-array of field effect transistors, and seventh sub-array of field effect transistors are approximately equal in size.

* * * * *